(12) United States Patent
Bernard et al.

(10) Patent No.: US 10,599,034 B2
(45) Date of Patent: Mar. 24, 2020

(54) METHOD FOR MANUFACTURING MEMS DEVICES AND NANO DEVICES WITH VARYING DEGREES OF HYDROPHOBICITY AND HYDROPHILICITY IN A COMPOSITE PHOTOIMAGEABLE DRY FILM

(71) Applicant: Funai Electric Co., Ltd., Osaka (JP)

(72) Inventors: David L. Bernard, Lexington, KY (US); Christopher A. Craft, Lexington, KY (US); David C. Graham, Lexington, KY (US); Sean T. Weaver, Lexington, KY (US)

(73) Assignee: Funai Electric Co., Ltd. (JP)

( * ) Notice: Subject to any disclaimer, the term of this patent is extended or adjusted under 35 U.S.C. 154(b) by 130 days.

(21) Appl. No.: 15/682,485

(22) Filed: Aug. 21, 2017

(65) Prior Publication Data

US 2019/0056660 A1  Feb. 21, 2019

(51) Int. Cl.

| | |
|---|---|
| *G03F 7/075* | (2006.01) |
| *G03F 7/095* | (2006.01) |
| *B41J 2/16* | (2006.01) |
| *G03F 7/022* | (2006.01) |
| *B81C 1/00* | (2006.01) |
| *B81B 3/00* | (2006.01) |
| *B81B 7/00* | (2006.01) |
| *G03F 7/00* | (2006.01) |
| *G03F 7/004* | (2006.01) |
| *G03F 7/038* | (2006.01) |

(52) U.S. Cl.
CPC .......... *G03F 7/0226* (2013.01); *B41J 2/1603* (2013.01); *B41J 2/1628* (2013.01); *B41J 2/1631* (2013.01); *B41J 2/1639* (2013.01); *B81B 3/0072* (2013.01); *B81B 7/0038* (2013.01); *B81C 1/00047* (2013.01); *B81C 1/00142* (2013.01); *B81C 1/00269* (2013.01); *B81C 1/00333* (2013.01); *G03F 7/0037* (2013.01); *G03F 7/0046* (2013.01); *G03F 7/0755* (2013.01); *G03F 7/095* (2013.01); *G03F 7/038* (2013.01); *G03F 7/0385* (2013.01)

(58) Field of Classification Search
CPC ........ B41J 2/1603; B41J 2/162; B41J 2/1631; G03F 7/0037; G03F 7/095; G03F 7/0955; G03F 7/2022; G03F 7/203; G03F 7/048; G03F 7/0755; G03F 7/2002
USPC ............................ 430/320; 347/47; 29/890.1
See application file for complete search history.

(56) References Cited

U.S. PATENT DOCUMENTS

| | | | |
|---|---|---|---|
| 4,509,063 | A | 4/1985 | Sugittani et al. |
| 4,596,759 | A | 6/1986 | Schupp et al. |
| 6,462,107 | B1 | 10/2002 | Sinclair et al. |
| 6,709,805 | B1 | 3/2004 | Patil |
| 7,001,708 | B1 | 2/2006 | Belfield |
| 7,265,044 | B2 | 9/2007 | Ohta et al. |

(Continued)

*Primary Examiner* — John A McPherson
(74) *Attorney, Agent, or Firm* — Luedeka Neely Group, PC

(57) ABSTRACT

A three-dimensional ("3D") structure for handling fluids, a fluid handling device containing the 3D structure, and a method of making the 3D structure. The method includes providing a composite photoresist material that includes: (a) a first layer devoid of a hydrophobicity agent and (b) at least a second layer comprising the hydrophobicity agent. The composite photoresist material is devoid of an adhesion promotion layer between layers of the composite photoresist material.

9 Claims, 6 Drawing Sheets

(56) References Cited

U.S. PATENT DOCUMENTS

| | | |
|---|---|---|
| 7,879,536 B2 | 1/2011 | Shin et al. |
| 7,954,926 B2* | 6/2011 | Bertelsen ............... B41J 2/1433 347/46 |
| 9,855,566 B1 | 1/2018 | Craft et al. |
| 2005/0221232 A1 | 10/2005 | Baldwin et al. |
| 2006/0284933 A1 | 12/2006 | Hatta |
| 2009/0091600 A1 | 4/2009 | Fannin et al. |
| 2009/0155729 A1 | 6/2009 | Weaver et al. |
| 2009/0185003 A1* | 7/2009 | Bertelsen ............... B41J 2/1433 347/47 |
| 2009/0201338 A1 | 8/2009 | Weaver et al. |
| 2011/0008732 A1 | 1/2011 | Ober et al. |
| 2012/0082933 A1* | 4/2012 | Wu ....................... G03F 7/0045 430/280.1 |
| 2014/0374143 A1 | 12/2014 | Okamoto et al. |
| 2015/0240071 A1 | 8/2015 | Okamoto et al. |
| 2015/0273825 A1 | 10/2015 | Ishii et al. |
| 2016/0041469 A1 | 2/2016 | Ikegame et al. |
| 2016/0236467 A1 | 8/2016 | Takahashi et al. |
| 2018/0086080 A1* | 3/2018 | Horiuchi ............... B41J 2/1404 |

\* cited by examiner

METHOD FOR MANUFACTURING MEMS DEVICES AND NANO DEVICES WITH VARYING DEGREES OF HYDROPHOBICITY AND HYDROPHILICITY IN A COMPOSITE PHOTOIMAGEABLE DRY FILM

TECHNICAL FIELD

The disclosure relates to MEMS and nano devices, and in particular to improved methods for making three-dimensional photoimaged structures having varying degrees of hydrophobicity and hydrophilicity.

BACKGROUND AND SUMMARY

Micro-electromechanical systems ("MEMS") and nano-devices typically include three-dimensional ("3D") structures made from photoimaged materials. In some applications, it is necessary for the 3D structures to have hydrophilic and/or hydrophobic properties. Examples of MEMS and nano-devices, include, but are not limited to fluid ejection heads, micro-filters, micro-separators, micro-sieves and other micro and nano scale fluid handling structures. Such structures may handle a wide variety of fluids. For example, fluid ejection heads are 3D nano devices that are useful for ejecting a variety of fluids including inks, cooling fluids, pharmaceuticals, lubricants and the like. A widely used fluid ejection head is in an ink jet printer. However, fluid ejection heads may also be used in vaporization devices for vapor therapy, E-cigarettes and the like. New techniques are constantly being developed to provide low cost, highly reliable fluid ejection heads for such devices.

The fluid ejection head is a seemingly simple device that has a relatively complicated structure containing electrical circuits, ink passageways and a variety of tiny parts assembled with precision to provide a powerful, yet versatile fluid ejection head. The components of the ejection head must cooperate with each other and be useful for a variety of fluids and fluid formulations. Accordingly, it is important to match the ejection head components to the fluid being ejected. Slight variations in production quality can have a tremendous influence on the product yield and resulting ejection head performance.

The primary components of a fluid ejection head are a semiconductor substrate, a flow feature layer, a nozzle plate layer, and a flexible circuit attached to the substrate. The semiconductor substrate is preferably made of silicon and contains various passivation layers, conductive metal layers, resistive layers, insulative layers and protective layers deposited on a device surface thereof. Fluid ejection actuators formed on a device surface of the substrate may be thermal actuators or piezoelectric actuators. For thermal actuators, individual heater resistors are defined in the resistive layers and each heater resistor corresponds to a nozzle hole in the nozzle plate for heating and ejecting fluid from the ejection head toward a desired substrate or target.

Current methods used to make the fluid flow layer and nozzle plate layer involve the use the combination of spin on photoresist or dry film photoresist with multiple image, develop, and bake steps for each layer. For example, in a conventional process, a first adhesion promotion layer is applied to a semiconductor substrate, a fluid flow layer of photoimagable material is spin coated onto the adhesion layer. The fluid flow layer is a negative photo resist layer that is imaged, cured, and developed. A second adhesion promotion layer is applied to the fluid flow layer before applying a nozzle layer. Next the photoimagable layer nozzle layer is laminated as a dry film to the fluid flow layer by means of the secondary adhesion promotion layer. The nozzle layer is imaged, cured and developed. The semiconductor substrate is then deep reactive ion etched (DRIE) to form vias through the substrate. Since the fluid flow layer and nozzle layer are already attached to the substrate, the process latitude for the DRIE process is limited.

In an alternative process, the semiconductor substrate is first etched to form vias using the DRIE process before or after an adhesion promotion layer is applied to the substrate. Then the fluid flow layer and nozzle layer are applied to the substrate as dry films that are each imaged and developed. Each dry film requires a separate adhesion promotion layer. There is a risk of adhesion loss between layers with the application of each additional adhesion promotion layer.

In a variation of the alternative process, the DRIE process is conducted after the fluid flow layer is applied to the substrate and is imaged and developed. Subsequent to the DRIE process, the nozzle layer is laminated to the fluid flow layer and is imaged and developed.

Regardless of the process used, the use of multiple layers requiring multiple adhesion promotors increases the process time for making the fluid ejection heads and increases the risk of loss due to adhesion layer failure. Also, the MEMS or nano-scale devices having a 3D structure may require a layer that is hydrophilic and a layer that is hydrophobic in order to efficiently process a fluid through the device. Accordingly, what is needed is a 3D structure and method for making the structure that enables control of fluid flow within a specific layer of a composite film of the 3D structure.

The disclosure provides a three-dimensional ("3D") structure for handling fluids, a fluid handling device containing the 3D structure, and a method of making the 3D structure. In one embodiment, the method includes providing a composite photoresist material that includes: (a) a first photoresist layer devoid of a hydrophobicity agent and (b) at least a second photoresist layer comprising the hydrophobicity agent. The composite photoresist material is devoid of an adhesion promotion layer between layers of the composite photoresist material.

In another embodiment, there is provided a method for making a three-dimensional ("3D") structure from a composite photoresist film. The method includes the steps of: (A) applying a first layer of photoresist material to a carrier film, the first layer being devoid of a hydrophobicity agent; (B) drying the first layer to provide a dried first layer; (C) applying a second layer of photoresist material to the dried first layer, the second layer comprising a hydrophobicity agent; (D) drying the second layer to provide a composite photoresist material devoid of intermediate adhesion layer(s); (E) applying an adhesion layer to a substrate surface; (F) laminating the composite photoresist material to the adhesion layer; (G) exposing the composite photoresist material to a first radiation exposure wavelength selected from e-line, g-line, h-line, i-line, mid ultraviolet (UV), and deep UV radiation; and (H) simultaneously developing the composite photoresist material to provide the 3D structure.

Another embodiment of the disclosure provides a fluid ejection device having a fluid ejection head that includes a semiconductor substrate containing a plurality fluid ejection actuators on a device surface thereof and one or more fluid supply vias etched therethrough. An adhesion promotion layer is applied to the device surface of the semiconductor substrate. A composite photoresist material is applied to the adhesion promotion layer wherein the composite photoresist material contains (a) a first photoresist layer devoid of a hydrophobicity agent and (b) at least a second photoresist layer comprising a hydrophobicity agent. The composite photoresist material is devoid of an adhesion promotion layer between layers of the composite photoresist material. A controller for activating the fluid ejection head is also provided.

In some embodiments, the composite photoresist material includes at least a third layer of photoresist material, wherein the third layer of photoresist material is devoid of a hydrophobicity agent.

In some embodiments, the composite photoresist material has a thickness ranging from about 6 to about 150 μm.

In some embodiments, the composite photoresist material is imaged with a radiation exposure wavelength selected from e-line, g-line, h-line, i-line, mid ultraviolet (UV), or deep UV radiation.

In some embodiments, each photoresist layer of the composite photoresist material is imaged with a different radiation exposure wavelength selected from e-line, g-line, h-line, i-line, mid ultraviolet (UV), or deep UV radiation.

A benefit of manipulating surface conditions of each layer of the composite photoresist material is the ability to create hydrophobic and hydrophilic surfaces that may be used in managing the performance of the MEMS or nano devices. Accordingly, embodiments of the disclosure simplify and enable multiple layers of MEMS and nano structures to have varying surface energies and surface tensions so as to manipulate flow, separation, filtration and mixing of water-based fluids.

Another advantage of the embodiments described herein is that the process steps for making 3D MEMS and nano devices are greatly simplified as described in more detail below and provides devices in higher yields due to a decrease in lamination adhesion failures.

BRIEF DESCRIPTION OF THE DRAWINGS

Further features and advantages of the disclosed embodiments will become apparent by reference to the detailed description when considered in conjunction with the figures, which are not to scale, wherein like reference numbers indicate like elements through the several views, and wherein.

DETAILED DESCRIPTION OF THE EMBODIMENTS

With regard to embodiments of the disclosure, various MEMS and nano devices may be made having the desired fluid flow properties. An example of such a device is a fluid ejection head. Accordingly, for simplification purposes, the description is directed specifically to fluid ejection heads. However, the embodiments described herein may be adapted for use in making a wide variety of 3D MEMS and nano devices as referenced above.

Figure 1:
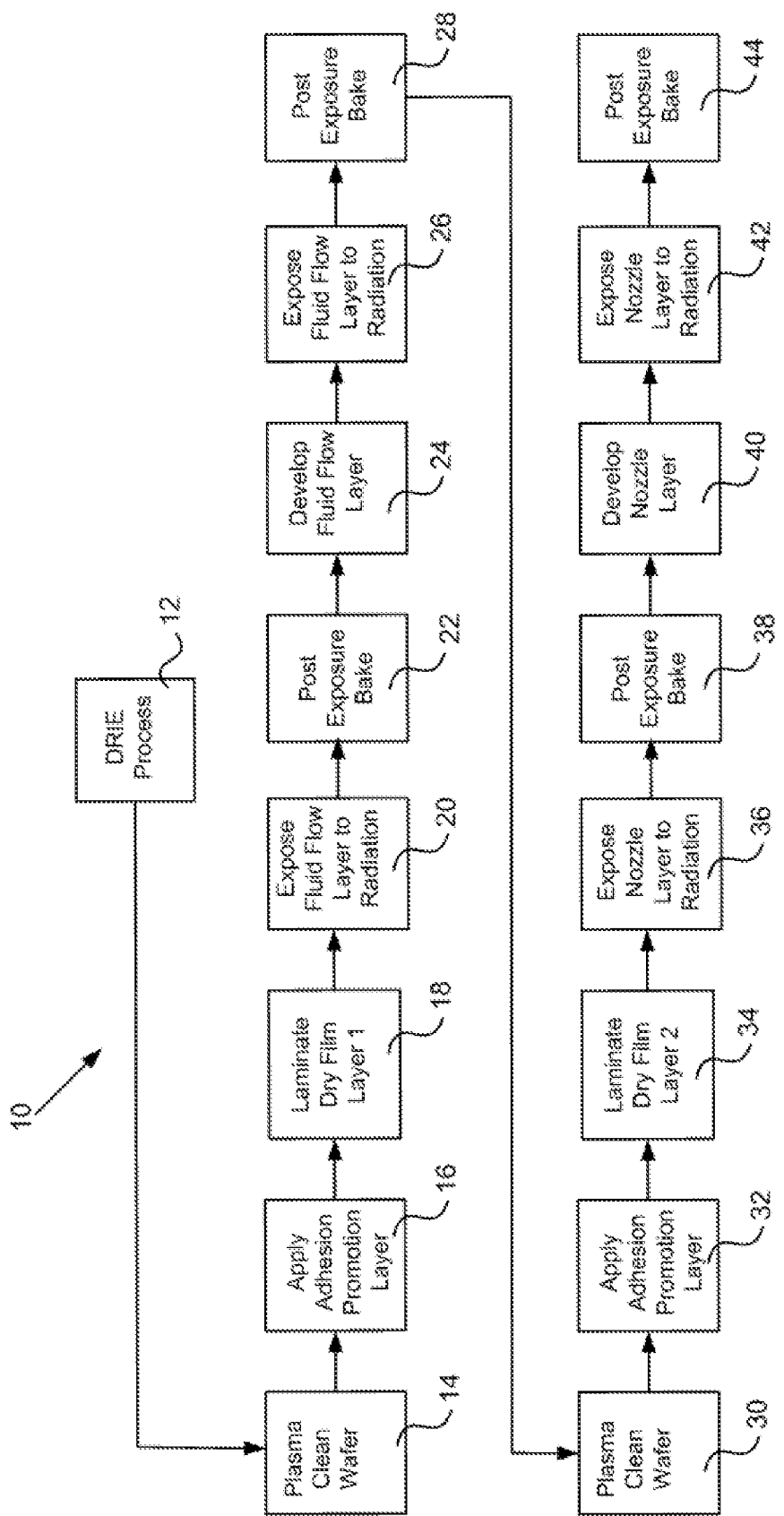
FIGS. 1-2 are flow diagrams of prior art processing steps for making a fluid ejection head.
Figure 2:
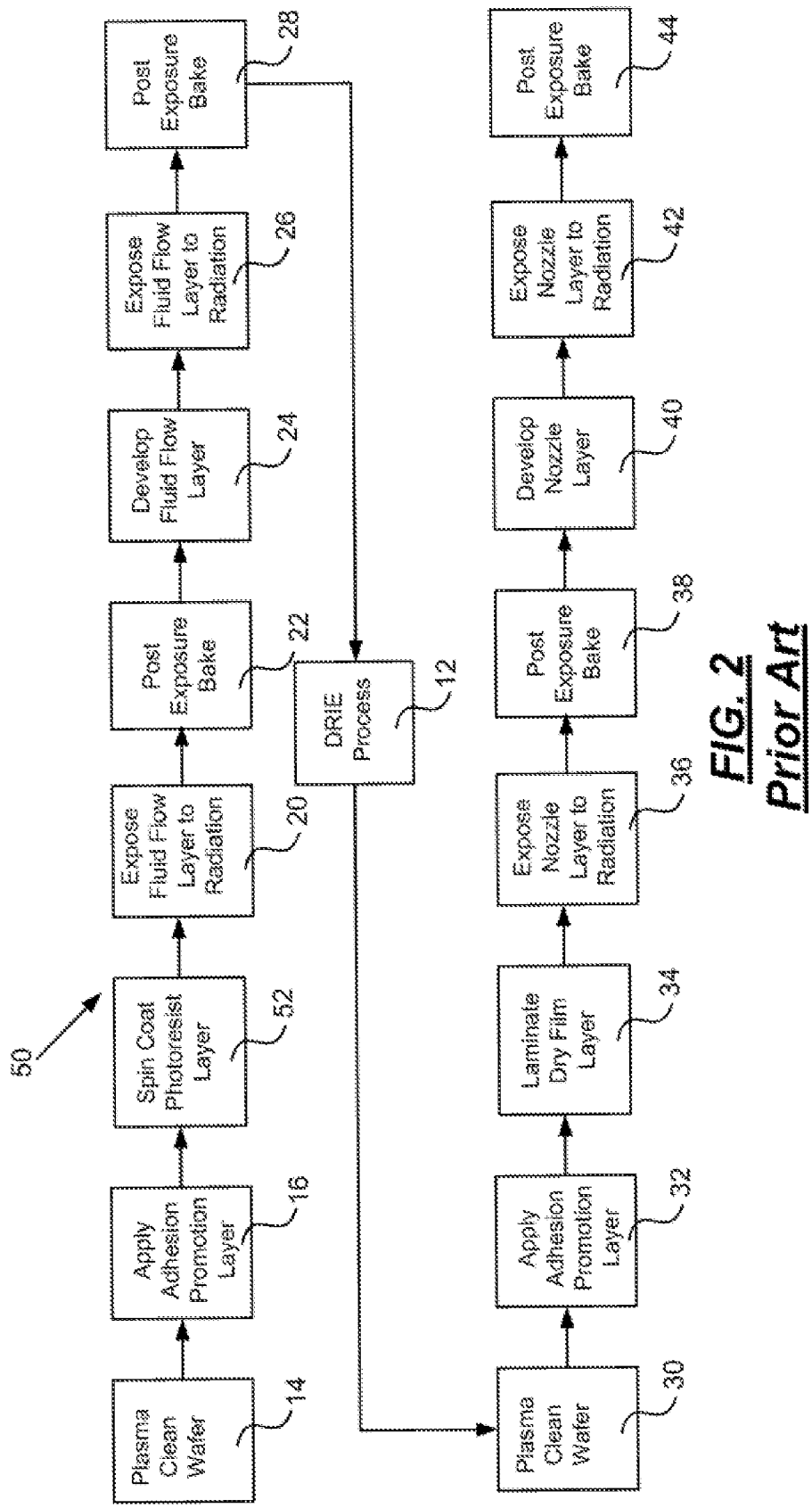

FIGS. 1 and 2, graphically illustrate block flow diagrams 10 and 50 of prior art process steps for making an ejection head. With reference to FIG. 1, the first step is a DRIE process 12 to etch fluid vias through a semiconductor substrate. Next, the substrate is plasma cleaned in step 14 and an adhesion promotion layer is applied to the substrate in step 16. A dry film layer that provides a fluid flow layer is applied to the adhesion layer in step 18. The fluid flow layer is exposed to radiation through a mask in step 20, and baked in step 22 to cure the exposed areas of the layer. Next the fluid flow layer is developed in step 24 to remove the masked areas of the fluid flow layer. The fluid flow layer is then exposed to ultraviolet (UV) radiation in step 26 and baked again in step 28 to remove any residual, photoacid generator, developer and/or uncured resin. The semiconductor substrate and fluid flow layer are plasma cleaned in step 30 and a second adhesion promotion layer is applied in step 32. A second dry film layer is laminated to the fluid flow layer in step 34 to provide a nozzle layer. The nozzle layer is exposed to radiation in step 36 to form nozzle holes in the nozzle layer. A second post exposure bake is performed in step 38 to cure the unmasked material in the nozzle layer. Next the nozzle layer is developed in step 40 to form the nozzle holes. The nozzle layer is exposed to UV radiation in step 42 and post exposure baked in step 44.

The primary differences between flow diagram 10 and flow diagram 50 is that in flow diagram 10, the DRIE process to form vias in the semiconductor substrate is conducted before any of the flow layers are applied to the substrate, whereas in diagram 50, the DRIE process is conducted after the fluid flow layer is applied to the substrate, exposed to radiation and developed. Since the semiconductor substrate does not already contain fluid vias, the fluid flow layer may can be spin-coated onto the substrate in step 52 rather than laminated to the adhesion layer. Otherwise, the process steps are similar to those described with reference to FIG. 1.

Figure 3:
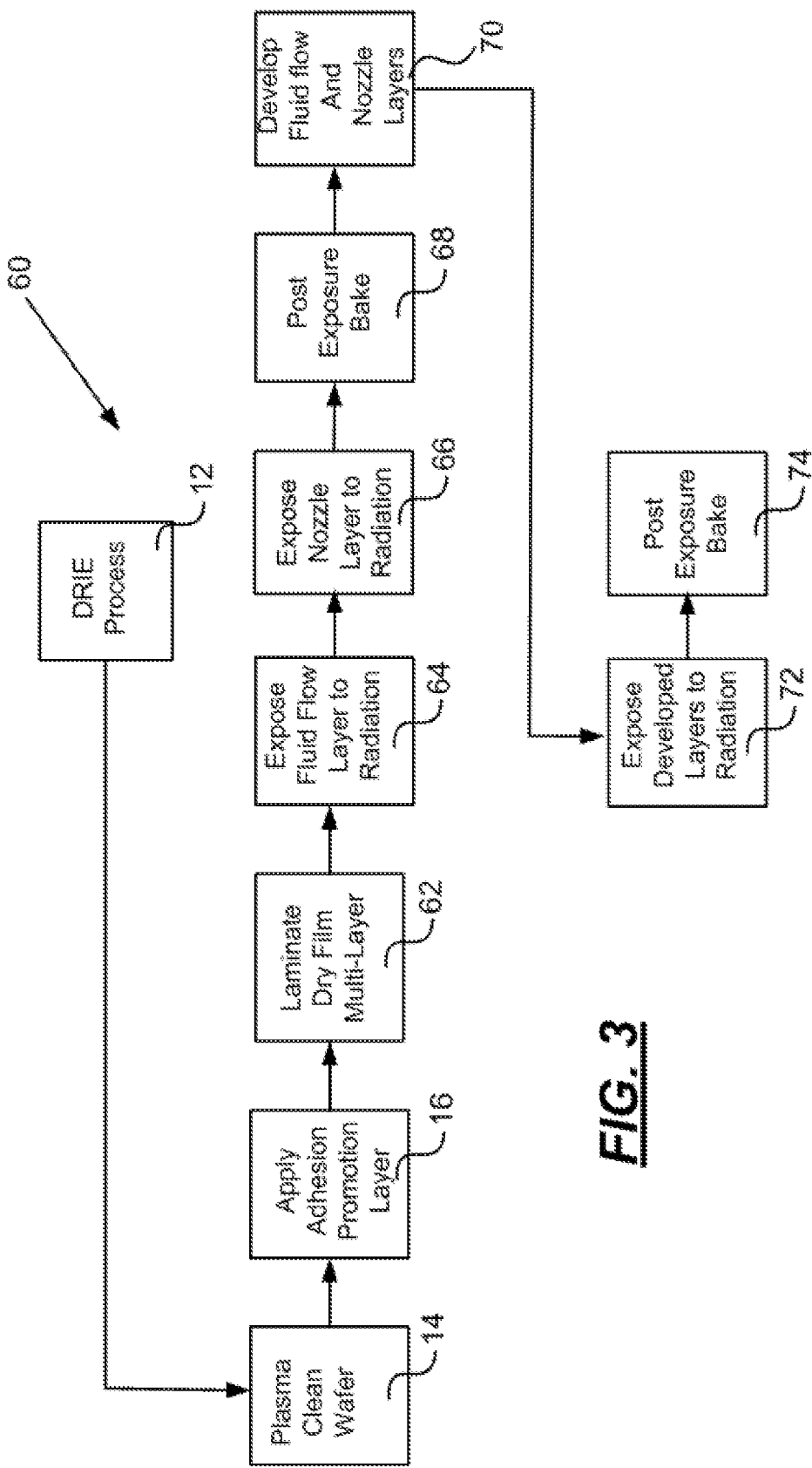
FIG. 3 is a flow diagram of process steps for making an ejection head according to an embodiment of the disclosure.

A simplified process 60 according to an embodiment of the disclosure is shown in FIG. 3. The first three steps of the process are similar to the first three steps of the prior art process 10. However, instead of laminating a single fluid flow layer to the substrate, a composite dry film layer is laminated in step 62 to the adhesion promotion layer. Next, the composite dry film layer is exposed to a first radiation source in step 64 through a mask to provide fluid flow features in the composite dry film layer. Prior to developing the fluid flow features, the composite dry film layer is exposed to a second radiation source through a second mask in step 66 to provide nozzle holes in the composite dry film layer. The composite dry film layer is then baked in step 68 to cure the masked areas of the composite dry film layer. In step 70, the composite dry film layer is developed to form fluid flow features and nozzle holes in the composite dry film layer. As in the prior art processes, the composite film layer is then exposed to UV radiation in step 72 and baked in step 74.

Figure 4A:
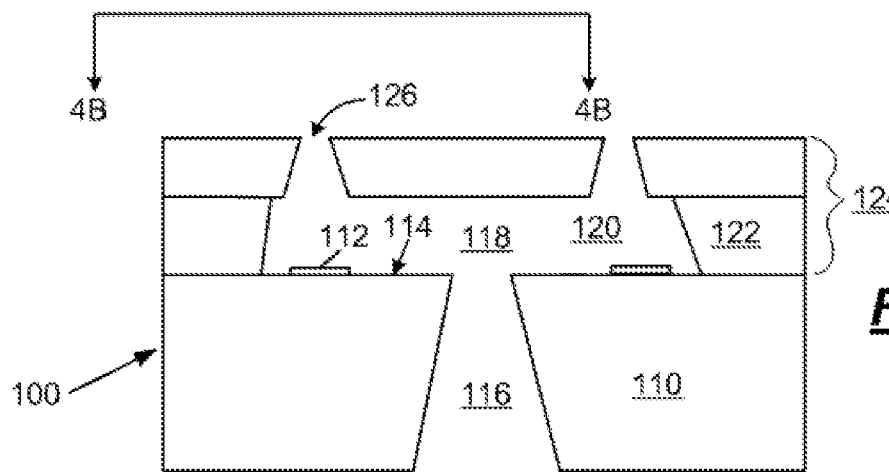
FIG. 4A is a schematic cross-sectional view, not to scale of a portion of a fluid ejection head according to the disclosure.
Figure 4B:
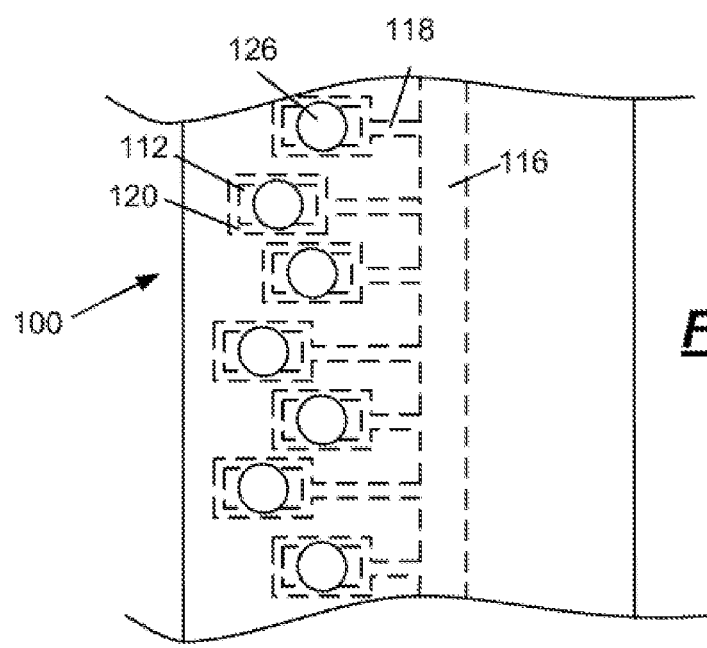
FIG. 4B is a plan schematic view, not to scale, of a portion of the fluid ejection head of FIG. 4A.

A portion of an ejection head 100 made by the foregoing process is illustrated in FIGS. 4A and 4B. The ejection head 100 includes a semiconductor substrate 110 that is preferably a silicon semiconductor substrate 110 containing a plurality of fluid ejection actuators such as piezoelectric devices or heater resistors 112 formed on a device side 114 of the substrate 110. Upon activation of heater resistors 112, fluid supplied through one or more fluid supply vias 116 in the semiconductor substrate 110 flows through a fluid supply channel 118 to a fluid chamber 120 in a portion 122 of the composite film layer 124 where the fluid is caused to be ejected through nozzle holes 126 in the composite film layer 124. Fluid ejection actuators, such as heater resistors 112, are formed on the device side 114 of the semiconductor substrate 110 by well-known semiconductor manufacturing techniques.

The semiconductor substrate 110 is relatively small in size and typically has overall dimensions ranging from about 2 to about 8 millimeters wide by about 10 to about 20 millimeters long and from about 0.4 to about 0.8 mm thick. In conventional semiconductor substrates 110, the fluid supply slots 116 are grit-blasted in the semiconductor substrates 110. Such slots 116 typically have dimensions of about 9.7 millimeters long and from about 50 to about 400 microns wide. Fluid may be provided to the fluid ejection actuators by a single one of the slots 116 or by a plurality of openings in the substrate 110 made by a dry etch process selected from reactive ion etching (RIE) or deep reactive ion etching (DRIE), inductively coupled plasma etching, and the like. The composite film layer 124 may be formed from one or more layers of negative photoresist material as described in more detail below. The composite film layer 124 may have a thickness ranging from about 6 to about 150 μm or more, such as from about 10 to about 80 μm.

The fluid supply slot 116 directs fluid from a fluid reservoir to which the ejection head 100 is attached through the fluid supply slot 116 to the device side 114 of the substrate 110 containing heater resistors 112. The device side 114 of the substrate 110 also preferably contains electrical tracing from the heater resistors 112 to contact pads used for connecting the substrate 110 to a flexible circuit or a tape automated bonding (TAB) circuit for supplying electrical impulses from a fluid ejection controller to activate one or more heater resistors 112 on the substrate 110.

Figure 5:
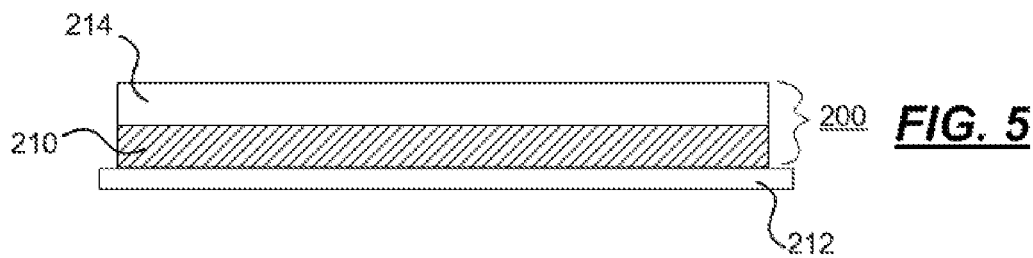
FIG. 5 is a cross-sectional view, not to scale, of a double-layer photoresist material according to an embodiment of the disclosure.

With reference to FIG. 5, there is illustrated a composite photoresist film layer 200 attached to a carrier film 212. The composite photoresist film layer 200 includes a first layer 210 that is formulated to contain a first photoacid generator having at least a first radiation exposure wavelength. The wavelength of the photoacid generator in the first layer 210 may be selected from e-line, g-line, h-line, i-line, mid UV, and deep UV radiation. The first radiation exposure wavelength, in some embodiments, may be greater than 350 nm. The thickness of the first layer 210 may range from about 3 to about 50 μm.

The composite film layer 200 may also contain a second layer 214 that is formulated to contain a hydrophobicity agent and a second photoacid generator having a second radiation exposure wavelength that is different from the first radiation exposure wavelength. The second radiation exposure wavelength may be selected from e-line, g-line, h-line, i-line, mid UV, and deep UV radiation. In some embodiments, the second radiation exposure wavelength may be less than 350 nm. The second layer 214 may have a thickness ranging from about 3 to about 100 μm.

The wavelengths provided by the radiations sources that may be used according to embodiments of the disclosure are as follows:
e-line=546 nm
g-line=435 nm
h-line=405 nm
i-line=365 nm
mid UV=310 nm
deep UV=254 nm.

The photoresist materials that contain the photoacid generators may be formulated to include one or more of a multi-functional epoxy compound, a di-functional epoxy compound, a relatively high molecular weight polyhydroxy ether, an adhesion enhancer, and an aliphatic ketone solvent. For purposes of the disclosure, "difunctional epoxy" means epoxy compounds and materials having only two epoxy functional groups in the molecule. "Multifunctional epoxy" means epoxy compounds and materials having more than two epoxy functional groups in the molecule.

A suitable multifunctional epoxy component for making a photoresist formulation used for the composite film layer 200 or 240 (FIG. 9) according to one embodiment of the disclosure, may be selected from aromatic epoxides such as glycidyl ethers of polyphenols. An exemplary first multifunctional epoxy resin is a polyglycidyl ether of a phenol-formaldehyde novolac resin such as a novolac epoxy resin having an epoxide gram equivalent weight ranging from about 190 to about 250 and a viscosity at 130° C. ranging from about 10 to about 60.

The multi-functional epoxy component of the photoresist formulation may have a weight average molecular weight of about 3,000 to about 5,000 Daltons as determined by gel permeation chromatography, and an average epoxide group functionality of greater than 3, preferably from about 6 to about 10. The amount of multifunctional epoxy resin in an exemplary photoresist formulation may range from about 30 to about 50 percent by weight based on the weight of the cured thick film layer 80.

The di-functional epoxy component may be selected from di-functional epoxy compounds which include diglycidyl ethers of bisphenol-A, 3,4-epoxycyclohexylmethyl-3,4-epoxycyclo-hexene carboxylate, 3,4-epoxy-6-methylcyclohexylmethyl-3,4-epoxy-6-methylcy-clohexene carboxylate, bis(3,4-epoxy-6-methylcyclohexylmethyl) adipate, and bis (2,3-epoxycyclopentyl) ether.

An exemplary di-functional epoxy component is a bisphenol-A/epichlorohydrin epoxy resin having an epoxide equivalent of greater than about 1000. An "epoxide equivalent" is the number of grams of resin containing 1 gram-equivalent of epoxide. The weight average molecular weight of the first di-functional epoxy component is typically above 2500 Daltons, e.g., from about 2800 to about 3500 weight average molecular weight. The amount of the first di-functional epoxy component in the photoresist formulation may range from about 30 to about 50 percent by weight based on the weight of the cured resin.

Exemplary photoacid generators include compounds or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist formulation in an amount ranging from about 5 to about 15 weight percent based on the weight of the cured resin.

Compounds that generate a protic acid when irradiated by active rays, may be used as the photoacid generator, including, but are not limited to, aromatic iodonium complex salts and aromatic sulfonium complex salts. Examples include di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide, bis-hexafluorophosphate, 4,4'-bis[di([beta]-hydroxyethoxy)phenylsulfonium]diphenylsulfide bis-hexafluoroantimonate, 4,4'-bis[di([beta]-hydroxyethoxy)(phenylsulfonium)diphenyl sulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butyl phenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl [4-(phenylthio)phenyl]sulfonium hexafluoroantimonate and the like.

The hydrophobicity agent that may be used in one or more layers of the composite photoresist material include silicon containing materials such as silanes and siloxanes. Accordingly, the hydrophobicity agent may be selected from heptadecafluoro-decyltrimethoxysilane, octadecyldimethylchlorosilane, octadecyltricholorsilane, methyltrimethoxysilane, octyltriethoxysilane, phenyltrimethoxysilane, t-butylmethoxysilane, tetraethoxysilane, sodium methyl siliconate, vinytrimethoxysilane, N-(3-(trimethoxysilyl)propyl)ethylenediamine, polymethylmethoxysiloxane, polydimethylsiloxane, polyethylhydrogensiloxane, and dimethyl siloxane. The amount of hydrophobicity agent in the cured composite film may about 0.5 to about 2 weight percent, such as from about 1.0 to about 1.5 weight percent based on total weight of the cured resin, including all ranges subsumed therein.

An exemplary solvent for use in the photoresist formulation is a solvent which is non-photoreactive. Non-photoreactive solvents include, but are not limited gamma-butyrolactone, $C_{1-6}$ acetates, tetrahydrofuran, low molecular weight ketones, mixtures thereof and the like. The non-photoreactive solvent is present in the formulation mixture used to provide the composite film layer 124 in an amount ranging from about 20 to about 90 weight percent, such as from about 40 to about 60 weight percent, based on the total weight of the photoresist formulation. In an exemplary embodiment, the non-photoreactive solvent does not remain in the cured composite film layer and is thus removed prior to or during the composite film layer curing steps.

The photoresist formulation may optionally include an effective amount of an adhesion enhancing agent such as a silane compound. Silane compounds that are compatible with the components of the photoresist formulation typically have a functional group capable of reacting with at least one member selected from the group consisting of the multifunctional epoxy compound, the difunctional epoxy compound and the photoinitiator. Such an adhesion enhancing agent may be a silane with an epoxide functional group such as 3-(guanidinyl)propyltrimethoxysilane, and a glycidoxyalkyltrialkoxysilane, e.g., gamma-glycidoxypropyltrimethoxysilane. When used, the adhesion enhancing agent can be present in an amount ranging from about 0.5 to about 2 weight percent, such as from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the composite film layer 200 or 240 adjacent the device surface 114 of the substrate 110.

Representative formulations for layers 210 and 214 are illustrated below in Tables 1 and 2.

TABLE 1

| Component | Layer 210 (phr) | Layer 214 (phr) |
|---|---|---|
| Methyl ethyl ketone solvent | balance | balance |
| Photoacid generator 1 | 3.5 | 3.5 |
| gamma-Butyrolactone solvent | 3.5 | 3.5 |
| Powder-grade phenoxy resin | 40 | 40 |
| Phenol-formaldehyde resin | 30 | 30 |
| Naphthalene epoxy resin | 30 | 30 |
| Thioxanthenone photoinitiator | 0.5 | 0.5 |
| Green Solvent Metal Complex Dye | 0.25 | 0.25 |
| 3-(guanidinyl)propyltrimethoxysilane | 2.22 | 2.22 |
| Hydrophobicity agent | 0 | 1.0 |
| Hydrophilic/Hydrophobic | Hydrophilic | Hydrophobic |
| Thickness (μm) | 45 | 5 |

TABLE 2

| Component | Layer 210 (phr) | Layer 214 (phr) |
|---|---|---|
| Methyl ethyl ketone solvent | balance | balance |
| Photoacid generator 1 | 3.5 | 3.5 |
| gamma-Butyrolactone solvent | 3.5 | 3.5 |
| Powder-grade phenoxy resin | 40 | 40 |
| Phenol-formaldehyde resin | 30 | 30 |
| Naphthalene epoxy resin | 30 | 30 |
| Thioxanthenone photoinitiator | 0.5 | 0.5 |
| Green Solvent Metal Complex Dye | 0.25 | 0.25 |
| 3-(guanidinyl)propyltrimethoxysilane | 2.22 | 2.22 |
| Hydrophobicity agent | 0 | 1.0 |
| Hydrophilic/Hydrophobic | Hydrophilic | Hydrophobic |
| Thickness (μm) | 45 | 20 |

Figure 6:
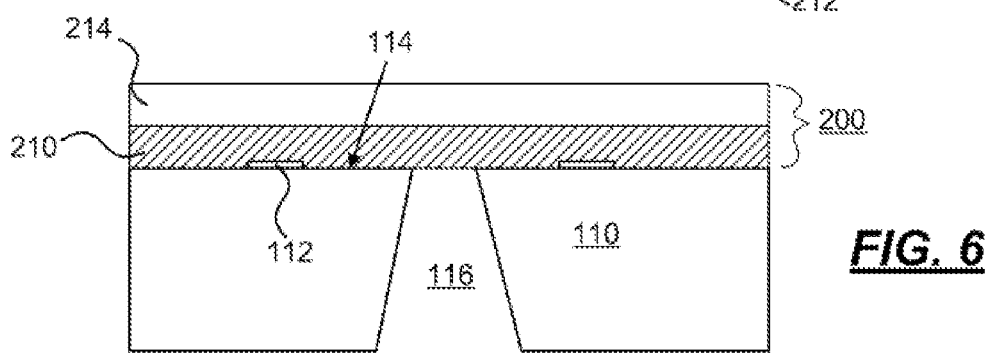
FIGS. 6-8 are schematic views, not to scale, of steps for making a fluid ejection head according to an embodiment of the disclosure.

In order to provide the composite film layer 200, the first layer 210 of photoresist resin containing may be coated onto the carrier film 210 and dried. Next the second layer 214 of photoresist resin containing the hydrophobicity agent may be coated onto the first layer 210 and dried. The composite dry film layer 200 may then be removed from the carrier film 212 and laminated to the device surface 114 of the substrate 110 as shown in FIG. 6 according to step 62 (FIG. 3).

Figure 7:
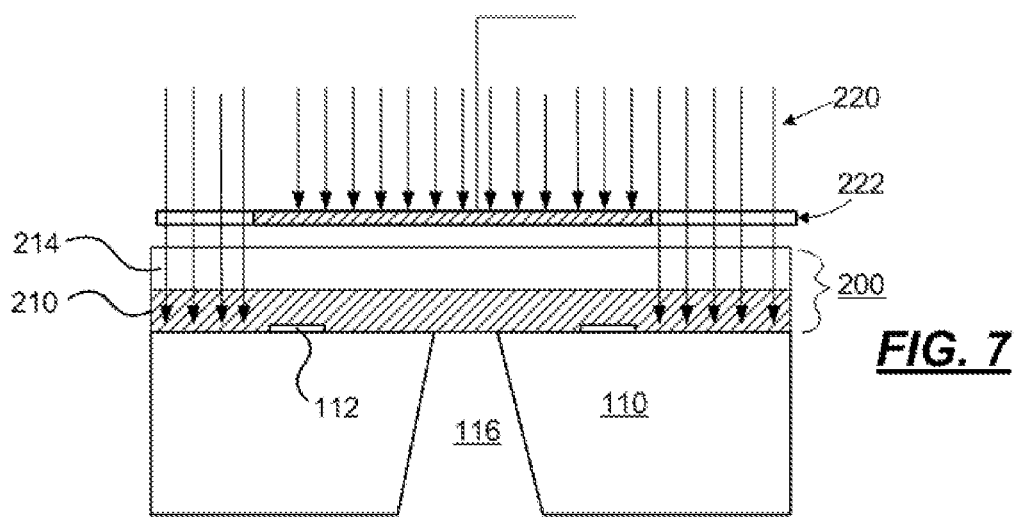
Figure 8:
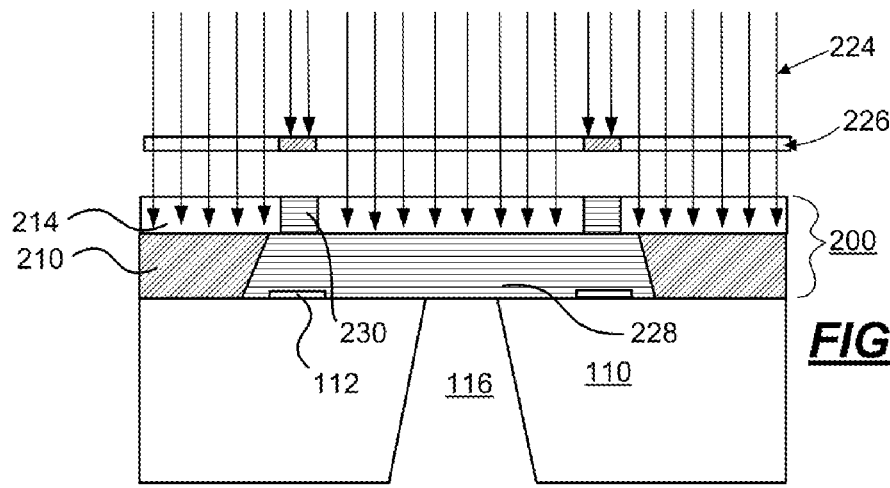

With reference to FIG. 7, the first layer 210 may be exposed to e-line, g-line, h-line, i-line, mid UV, or deep UV radiation 220 through a mask 222 to provide formation of the flow features in the first layer 210 of the composite film layer 200. Next, as shown in FIG. 8, the second layer 214 of the composite film layer 200 is exposed to e-line, g-line, h-line, i-line, mid UV, or deep UV radiation 224 through a second mask 226 to provide the nozzle features in the second layer 214 of the composite film. FIG. 8 illustrates the undeveloped flow features 228 and undeveloped nozzle features 230 in the composite film layer 200.

After exposing the composite film 200 to radiation, the composite film layer 200 is heated to cross-link the photoresist material in the exposed areas thereof. A developer solvent is then applied to the substrate 110 and composite film layer 200 to remove uncured photoresist material thereby forming the fluid supply channels 118 (FIGS. 4A-4B), fluid chambers 120, and nozzle holes 126 therein. In one embodiment, the substrate 110 containing the radiation exposed composite film layer 200 is placed in a developer bath using megasonic agitation to dissolve the uncrosslinked materials in both the first layer 210 and the second layer 214 so that the uncrosslinked material from the layer 210 is dissolved through the previously formed via 116 and the uncrosslinked material from 214 is dissolved to form the nozzle holes 126 in layer 214. Illustrative developers used in the developer bath include, for example, butyl cellosolve acetate, cyclohexanone, methyl ethyl ketone, a xylene and butyl cellosolve acetate mixture, and $C_{1-6}$ acetates like butyl acetate, or a combination of two or more of the foregoing. A third heating step at a temperature of about 200° C. for about 2 hours may be used to remove any residual photoacid generator that may be in the composite film layer 200.

Figure 9:
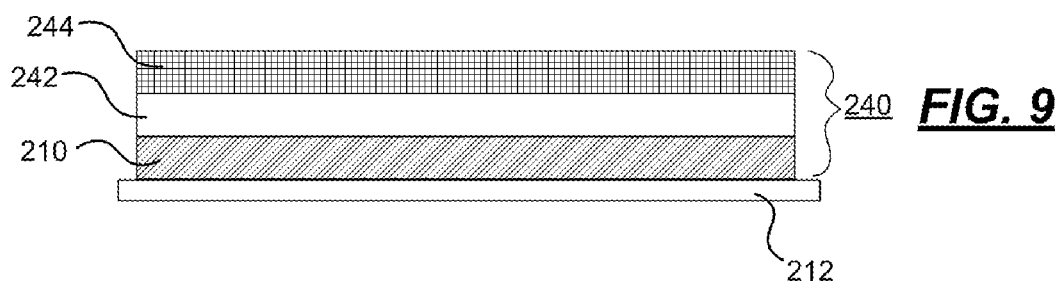
FIG. 9 is a cross-sectional view, not to scale, of a triple-layer photoresist material according to an embodiment of the disclosure.

In an alternative embodiment illustrated in FIG. 9, the composite film layer 240 may attached to the carrier film 212. The composite photoresist film layer 240 includes the first layer 210 that is formulated to be devoid of a hydrophobicity agent. The thickness of the first layer 210 may range from about 3 to about 50 µm. The composite film layer 240 may also contain a second layer 242 that is formulated to contain a hydrophobicity agent. The second layer 242 may have a thickness ranging from about 3 to 50 µm. In one embodiment, a third layer 244 devoid of a hydrophobicity agent may be applied to the second layer 242. The third layer 244 may have a thickness ranging from about 3 to about 50 µm and may be exposed to e-line, g-line, h-line, i-line, mid UV, or deep UV radiation through a mask to form flow features in the third layer 244.

Representative formulations for layers 210, 242 and 244 are illustrated below in Tables 3 and 4.

TABLE 3

| Component | Layer 210 (phr) | Layer 242 (phr) | Layer 244 (phr) |
|---|---|---|---|
| Methyl ethyl ketone solvent | balance | balance | balance |
| Photoacid generator 1 | 3.5 | 3.5 | 3.5 |
| gamma-Butyrolactone solvent | 3.5 | 3.5 | 3.5 |
| Powder-grade phenoxy resin | 40 | 40 | 40 |
| Phenol-formaldehyde resin | 30 | 30 | 30 |
| Naphthalene epoxy resin | 30 | 30 | 30 |
| Thioxanthenone photoinitiator | 0.5 | 0.5 | 0.5 |
| Green Solvent Metal Complex Dye | 0.25 | 0.25 | 0.5 |
| 3-(guanidinyl)propyltrimethoxysilane | 2.22 | 2.22 | 2.22 |
| Hydrophobicity agent | 0 | 1 | 0 |
| Hydrophilic/hydrophobic | Hydrophilic | Hydrophobic | Hydrophilic |
| Thickness (µm) | 45 | 5 | 20 |

TABLE 4

| Component | Layer 210 (phr) | Layer 242 (phr) | Layer 244 (phr) |
|---|---|---|---|
| Methyl ethyl ketone solvent | balance | balance | balance |
| Photoacid generator 1 | 3.5 | 0 | 0 |
| Photoacid generator 2 | 0 | 3.5 | 0 |
| Photoacid generator 3 | 0 | 0 | 3.5 |
| gamma-Butyrolactone solvent | 3.5 | 3.5 | 3.5 |
| Powder-grade phenoxy resin | 40 | 40 | 40 |
| Phenol-formaldehyde resin | 30 | 30 | 30 |
| Naphthalene epoxy resin | 30 | 30 | 30 |
| Thioxanthenone photoinitiator | 0.5 | 0.5 | 0.5 |
| Green Solvent Metal Complex Dye | 0.25 | 0 | 0 |
| 3-(guanidinyl)propyltrimethoxysilane | 2.22 | 2.22 | 2.22 |
| Hydrophobicity agent | 0 | 1 | 0 |
| Hydrophilic/hydrophobic | Hydrophilic | Hydrophobic | Hydrophilic |
| Thickness (µm) | 45 | 20 | 20 |

By using the composite film layers 200 and 240 described above, the use of multiple adhesion promotion steps for making the fluid ejection head may be avoided. Also, as shown above, each layer may have the same or different photoacid generators and thus may be imaged with different radiation exposure wavelengths. Since the formulations of each layer are similar, except for the photoacid generator, small amount of green dye, and hydrophobicity agent or lack thereof, the photoresist materials will mix and adhere to each other at the interface between the layers without the need for an adhesion promotion layer. The amount of green dye may be varied in the layers to further enhance the radiation wavelengths needed to image the layers. The multiple photoacid generator dryfilm layers also allow for imaging structures below open areas in the upper layers of the dryfilm.

Each layer may have a higher or lower affinity for aqueous fluids depending on the presence or absence of the hydrophobicity agent. Accordingly, a MEMS or nano device having multiple surface energies may enable tailoring of specific layers' surface tension/energy to help create microfilters, micro-separators, micro-sieves and other micro and nano scale fluid handling structures. Internal flow rates of a variety of fluids may be adjusted and tailored within such a device. Hence, embodiments of the disclosure may have application in several fields, as nanoscale liquid flow and effective viscosity may be manipulated significantly by the type of material used as a container or fluid conduit. The smaller the dimensions of the MEMS or nano device, the greater the effect of the liquid-surface interaction forces. Accordingly, the disclosure provides the construction of such devices on a particular chip. Materials such as amino acids, which can be hydrophilic or hydrophobic, may be combined and separated in such a device.

Having described various aspects and embodiments of the disclosure and several advantages thereof, it will be recognized by those of ordinary skills that the embodiments are susceptible to various modifications, substitutions and revisions within the spirit and scope of the appended claims.

What is claimed is:

1. A three-dimensional ("3D") structure comprising a composite photoresist material that includes: (a) a first photoresist layer devoid of a hydrophobicity agent and (b) at least a second photoresist layer comprising the hydrophobicity agent selected from the group consisting of octadecyldimethylchlorosilane, octadecyltricholorsilane, methyltrimethoxysilane, octyltriethoxysilane, phenyltrimethoxysilane, t-butylmethoxysilane, tetraethoxysilane, sodium methyl siliconate, vinytrimethoxysilane, N-(3-(trimethoxysilyl)propyl)ethylenediamine, polymethylmethoxysiloxane, polydimethylsiloxane, polyethylhydrogensiloxane, and dimethyl siloxane, wherein the composite photoresist material is devoid of an adhesion promotion layer between layers of the composite photoresist material, wherein each photoresist layer of the composite photoresist material is selected from the group consisting of a polyglycidyl ether of a phenolformaldehyde novolac resin, a diglycidyl ether of bisphenol-A, 3,4-epoxycyclohexylmethyl-3,4-epoxycyclo-hexene carboxylate, 3,4-epoxy-6-methylcyclohexylmethyl-3,4-epoxy-6-methylcyclohexene carboxylate, bis(3,4-epoxy-6-methylcyclohexylmethyl) adipate, and bis(2,3-epoxycyclopentyl) ether, and wherein each photoresist layer of the composite photoresist material is imagable with a different radiation exposure wavelength selected from the group consisting of e-line, g-line, h-line, i-line, mid ultraviolet (UV), and deep UV radiation.

2. The 3D structure of claim 1, wherein the composite photoresist material comprises at least a third layer of photoresist material that is devoid of a hydrophobicity agent.

3. The 3D structure of claim 1, wherein the composite photoresist material has a thickness ranging from about 6 to about 150 μm.

4. A method for making a three-dimensional ("3D") structure from a composite photoresist film comprising the steps of:
(A) applying a first layer of photoresist material to a carrier film, the first layer being devoid of a hydrophobicity agent;
(B) drying the first layer to provide a dried first layer;
(C) applying a second layer of photoresist material to the dried first layer, the second layer comprising a hydrophobicity agent selected from the group consisting of octadecyldimethylchlorosilane, octadecyltricholorsilane, methyltrimethoxysilane, octyltriethoxysilane, phenyltrimethoxysilane, t-butylmethoxysilane, tetraethoxysilane, sodium methyl siliconate, vinytrimethoxysilane, N-(3-(trimethoxysilyl)propyl)-ethylenediamine, polymethylmethoxysiloxane, polydimethylsiloxane, polyethylhydrogensiloxane, and dimethyl siloxane;
(D) drying the second layer to provide a composite photoresist material devoid of intermediate adhesion layer(s), wherein each layer of the composite photoresist material is selected from the group consisting of a polyglycidyl ether of a phenolformaldehyde novolac resin, a diglycidyl ether of bisphenol-A, 3,4-epoxycyclohexylmethyl-3,4-epoxycyclohexene carboxylate, 3,4-epoxy-6-methylcyclohexylmethyl-3,4-epoxy-6-methylcyclohexene carboxylate, bis(3,4-epoxy-6-methylcyclohexylmethyl) adipate, and bis(2,3-epoxycyclopentyl) ether, and wherein each layer of the composite photoresist material is imagable with a different radiation exposure wavelength;
(E) applying an adhesion layer to a substrate surface;
(F) laminating the composite photoresist material to the adhesion layer;
(G) exposing the composite photoresist material to a radiation exposure wavelength selected from the group consisting of e-line, g-line, h-line, i-line, mid ultraviolet (UV), and deep UV radiation; and
(H) simultaneously developing the composite photoresist material to provide the 3D structure.

5. The method of claim 4, further comprising applying a third layer of photoresist material to the dried second layer to provide the composite photoresist material, wherein the third layer of photoresist material is devoid of a hydrophobicity agent.

6. The method of claim 4, wherein the composite photoresist material has a thickness ranging from about 6 to about 150 μm.

7. A fluid ejection device having a fluid ejection head comprising:
a semiconductor substrate containing a plurality fluid ejection actuators on a device surface thereof and one or more fluid supply vias etched therethrough;
an adhesion promotion layer applied to the device surface of the semiconductor substrate;
a composite photoresist material applied to the adhesion promotion layer wherein the composite photoresist material comprises (a) a first photoresist layer devoid of a hydrophobicity agent and (b) at least a second photoresist layer comprising a hydrophobicity agent selected from the group consisting of octadecyldimethylchlorosilane, octadecyltricholorsilane, methyltrimethoxysilane, octyltriethoxysilane, phenyltrimethoxysilane, t-butylmethoxysilane, tetraethoxysilane, sodium methyl siliconate, vinytrimethoxysilane, N-(3-(trimethoxy-silyl)propyl)ethylenediamine, polymethylmethoxysiloxane, polydimethylsiloxane, polyethylhydrogensiloxane, and dimethyl siloxane wherein the composite photoresist material is devoid of an adhesion promotion layer between layers of the composite photoresist material, wherein each photoresist layer of the composite photoresist material is selected from the group consisting of a polyglycidyl ether of a phenolformaldehyde novolac resin, a diglycidyl ether of bisphenol-A, 3,4-epoxycyclohexylmethyl-3,4-epoxycyclo-hexene carboxylate, 3,4-epoxy-6-methylcyclohexylmethyl-3,4-epoxy-6-methylcyclohexene carboxylate, bis(3,4-epoxy-6-methylcyclohexylmethyl) adipate, and bis(2,3-epoxycyclopentyl) ether, and wherein each photoresist layer of the composite photoresist material is imagable with a different radiation exposure wavelength selected from the group consisting of e-line, g-line, h-line, i-line, mid ultraviolet (UV), and deep UV radiation; and
a controller for activating the fluid ejection head.

8. The fluid ejection device of claim 7, wherein the composite photoresist material comprises at least a third layer of photoresist material devoid of a hydrophobicity agent.

9. The fluid ejection device of claim 7, wherein the composite photoresist material has a thickness ranging from about 6 to about 150 μm.

* * * * *